METHOD OF MANUFACTURING SEMICONDUCTOR DEVICES ON SUBSTRATES CONSISTING OF SINGLE CRYSTALS

Filed Oct. 26, 1967

INVENTORS.
JOHAN C. M. BASART
WILHELMUS F. KNIPPENBERG
GERRIT VERSPUI
BY
AGENT

United States Patent Office 3,546,032

Patented Dec. 8, 1970

3,546,032

METHOD OF MANUFACTURING SEMICONDUCTOR DEVICES ON SUBSTRATES CONSISTING OF SINGLE CRYSTALS

Johan Charles Marie Basart, Heeze, and Wilhelmus Franciscus Knippenberg and Gerrit Verspui, Emmasingel, Eindhoven, Netherlands, assignors, by mesne assignments, to U.S. Philips Corporation, New York, N.Y., a corporation of Delaware Filed Oct. 26, 1967, Ser. No. 678,438
Claims priority, application Netherlands, Nov. 1, 1966, 6615376
Int. Cl. H01l 7/00, 7/38
U.S. Cl. 148—171 5 Claims

ABSTRACT OF THE DISCLOSURE

A method of growing epitaxial layer portions on selected areas of a single crystal semiconductive substrate is described. The epitaxial layer is grown from a solution of the semiconductor in a volatile solvent. After melting of the solution, it is heated until the solvent is completely evaporated causing the semiconductor remaining behind to grow epitaxially on the substrate.

Figure 1:
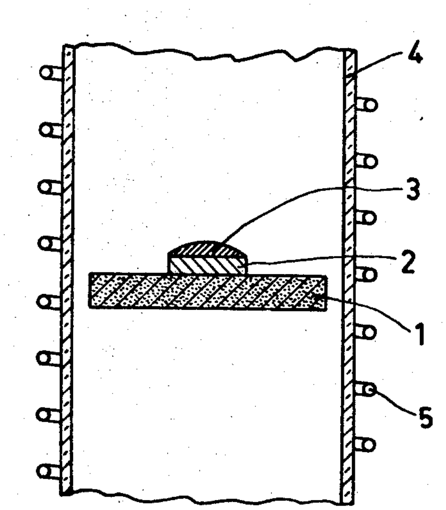

The invention relates to a method of manufacturing a semiconductor device on a substrate consisting of a single crystal of semiconductor material by local epitaxial growth of the same semiconductor material having conduction properties different from those of the substrate crystal.

It is known that silicon carbide crystals can be grown epitaxially from a solution in molten chromium.

This method was used for manufacturing silicon carbide crystals by slowly drawing a seed crystal from a saturated chromium solution.

This method was also used in a technique for manufacturing silicon carbide crystals which is referred to as "travelling solvent method."

As is known, such methods, in which solvents are used, have also been described in the literature for other semiconductors. For example, tin may be used as a solvent with silicon.

According to the invention, in the manufacture of semiconductor devices, the known above described possibility of crystallizing semi-conductor materials from a solution is utilized.

The invention relates to a method of manufacturing a semi-conductor device on a substrate consisting of a single crystal of semi-conductor material by epitaxial growth of a semi-conductor material having conduction properties different from those of the substrate crystal from solution. The method differs from the prior art in that the semi-conductor material, as the case may be together with additions determining the conduction properties, is locally applied to the substrate in a solvent, the assembly then being heated at a temperature at which a molten solution of the semiconductor material is formed, whereupon the solvent is withdrawn from the melt and the semi-conductor material deposits on the substrate as an epitaxial layer where locally applied.

The solvent may be withdrawn from the melt by evaporation. Preferably, the evaporation is accelerated by melting the solution at a reduced pressure, particularly in a vacuum.

Especially if the solvent evaporates very slowly, it may also be withdrawn chemically by adding to the atmosphere a gas which reacts only with the solvent to form a volatile compound.

The solvent and the semi-conductor material may be applied in the form of a mixture, but the materials are preferably applied in the form of solution or an alloy in a solid state.

In another favourable embodiment of the invention, the substrate is locally covered with the solvent, for example, by vapour deposition or by application in the form of a foil, the semi-conductor material being provided on this layer. The quantity of solvent is generally chosen so that the applied semi-conductor material can be entirely dissolved therein.

As an alternative, however, a smaller quantity of solvent may be applied so that an applied crystal having given conduction properties remains partly intact and is partly grown epitaxially on the substrate, though by the action of additonis and/or of the solvent, the growth then having different conduction properties.

This embodiment may be used advantageously for manufacturing integrated circuits in which a pattern of a solvent is vapour-deposited on a substrate crystal and the semi-conductor material is grown epitaxially on this pattern.

The invention will now be described more fully with reference to a few examples.

EXAMPLE 1

As shown diagrammatically in FIG. 1 of the drawing, an n-type silicon carbide crystal 2 doped with nitrogen is placed on a pyrographite plate 1. On this crystal is disposed a piece 3 consisting of a 20% solution of silicon carbide in chromium. The assembly is enclosed by a quartz vessel 4 containing helium at a pressure of 300 mm. A thermal treatment is carried out with the aid of a high-frequency coil 5 and the piece 3 is caused to melt at a temperature of 1600° C. The chromium then evaporates at such a rate that the rate of growth on the silicon carbide crystal is 250$\mu$ per hour. The grown silicon carbide is p-type conducting due to a small content of chromium.

Alternatively, a chromium solution may be used which contains beside silicon carbide aluminum as an accepter. In this case, the content of aluminum must be chosen to be high, for example, 20% since the melting and evaporation of the solvent involve great losses of aluminum by evaporation.

EXAMPLE 2

Figure 2:
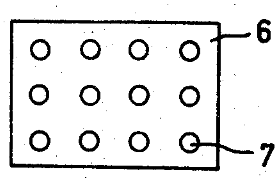

A nitrogen-doped plate-shaped silicon carbide crystal 6 of 5 x 10 mm. is provided, as shown in FIG. 2, with a pattern of disc-shaped pieces of foil 7 having a diameter of 1 mm. and a thickness of 100$\mu$ and consisting of an alloy of chromium with 20% of silicon carbide and 20% of aluminum.

Figure 3:
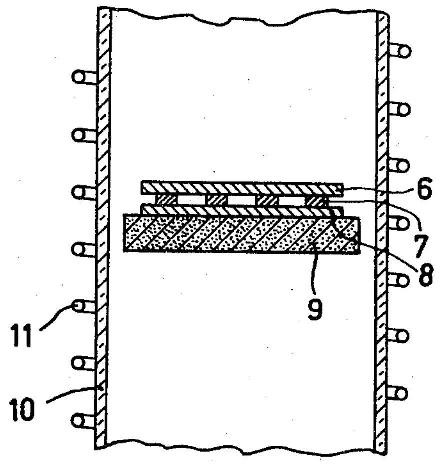

As shown in sectional view in FIG. 3, this crystal 6 is placed together with an identical crystal 8 on a plate 9 of pyrographite. The assembly is heated in a quartz vessel 10 filled with helium at a pressure of 300 mm. with the aid of a high-frequency coil 11 at 1600° C. The chromium and part of the aluminum evaporates and p-type regions are formed between the two n-type crystals in accordance with the pattern originally applied. Thus, npn-structures are obtained.

Similarly, pnp-structures can be obtained by starting from boron-doped p-type silicon carbide crystals provided with a vapour-deposited chromium pattern and by carrying out the thermal treatment in helium containing 1% of nitrogen. In this case, silicon carbide of the crystals is dissolved at the areas to which chromium is applied. The presence of nitrogen in the gas atmosphere results in epitaxial growth of n-type regions between the p-type crystals during evaporation of the chromium.

EXAMPLE 3

A plate of an alloy of gallium with 4 mol. percent of gallium phosphide and 0.04 mol. percent of tellurium is disposed on a zinc-doped gallium phosphide crystal. The assembly is placed in a quartz tube on a quartz plate, and is then heated with the aid of a furnace at 1050° C. in a current of chlorine flowing at a rate of 50 ccs. per minute. Gallium is withdrawn from the molten solution by the chlorine by the formation of volatile gallium chloride so that the presence of tellurium in the melt results in epitaxial growth of n-type gallium phosphide on the crystal. The rate of growth is 30$\mu$ per hour.

What is claimed is:

1. A method of growing on a selected portion of a single crystal semiconductive substrate an epitaxial layer portion of the same semiconductive material but having different electrical properties than that of the substrate, comprising the steps of providing the single crystal semiconductive substrate having an extended surface, applying on to a selected portion only, which is less than the whole, of the substrate surface a solution of said semiconductive material in a solvent for said semiconductor which solvent is more volatile than the semiconductor, heating the substrate and solution at a temperature at which the solution became molten but below the melting point of the substrate, continuing to heat the molten solution to evaporate off the solvent until the solvent completely evaporates off causing the semiconductor solute remaining behind to deposit and grow epitaxially as a layer on the local substrate surface portion to which applied.

2. A method as set forth in claim 1 wherein the semiconductor is silicon carbide and the solvent comprises chromium.

3. A method as set forth in claim 2 wherein the heating-evaporation step is carried out in an atmosphere at a pressure reduced below atmospheric pressure.

4. A method as set forth in claim 3 wherein the solution is applied in the form of spaced solid masses on a common substrate, producing after the evaporation step separated epitaxial layers on the common substrate.

5. A method as set forth in claim 4 wherein the substrate is of one conductivity type, the solution contains impurities of the opposite forming conductivity type, and the epitaxial layers resulting are of the opposite conductivity type forming spaced p-n junctions with the substrate.

References Cited

UNITED STATES PATENTS

| | | | |
|---|---|---|---|
| 2,996,456 | 8/1961 | Hergenrother | 252—62.3 |
| 3,082,126 | 3/1963 | Chang | 148—1.5 |
| 3,124,454 | 3/1964 | Berman | 75—177 |
| 3,186,880 | 6/1965 | Skaggs et al. | 148—1.6 |
| 3,205,101 | 9/1965 | Mlavsky et al. | 148—171 |
| 3,278,342 | 10/1966 | John et al. | 148—1.6 |
| 3,290,188 | 12/1966 | Ross | 148—177 |
| 3,305,385 | 2/1967 | Pizzarello | 117—106 |
| 3,393,103 | 7/1968 | Hellbardt et al. | 148—175 |
| 3,396,059 | 8/1968 | Giammanco | 148—171 |
| 3,427,211 | 2/1969 | Foster et al. | 148—171 |

OTHER REFERENCES

Trumbore, F. A.: "Metallurgy of Elemental and Compound Semiconductors," vol. 12, pp. 15–34, 1960.

L. DEWEY RUTLEDGE, Primary Examiner

WILLIAM G. SABA, Assistant Examiner

U.S. Cl. X.R.

23—204, 208, 273, 301; 117—200, 212; 148—1.5, 1.6, 172, 177; 252—62.3